United States Patent
Hsu et al.

(10) Patent No.: US 7,326,994 B2
(45) Date of Patent: Feb. 5, 2008

(54) LOGIC COMPATIBLE NON-VOLATILE MEMORY CELL

(75) Inventors: Te-Hsun Hsu, Hsinchu (TW); Hung-Cheng Sung, Hsinchu (TW); Wen-Ting Chu, Kaihsiung County (TW); Shih-Wei Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 143 days.

(21) Appl. No.: 11/248,357

(22) Filed: Oct. 12, 2005

(65) Prior Publication Data

US 2007/0120172 A1   May 31, 2007

(51) Int. Cl.
*H01L 29/788* (2006.01)
(52) U.S. Cl. ........................ 257/315; 257/298
(58) Field of Classification Search ........... 257/322, 257/202, 313, 346, 365, 366, 382, 387, 390, 257/315, 296, 298, 321
See application file for complete search history.

(56) References Cited

U.S. PATENT DOCUMENTS

| | | | | |
|---|---|---|---|---|
| 5,293,337 A | * | 3/1994 | Aritome et al. | 365/185.17 |
| 5,295,096 A | * | 3/1994 | Nakajima | 365/185.28 |
| 5,323,039 A | * | 6/1994 | Asano et al. | 257/315 |
| 5,446,303 A | * | 8/1995 | Quill et al. | 257/360 |
| 5,793,673 A | * | 8/1998 | Pio et al. | 365/185.01 |
| 5,889,700 A | * | 3/1999 | Bergemont et al. | 365/185.18 |
| 6,172,392 B1 | * | 1/2001 | Schmidt et al. | 257/315 |
| 6,295,229 B1 | * | 9/2001 | Chang et al. | 365/185.28 |
| 6,512,699 B2 | * | 1/2003 | Ogane | 365/185.26 |
| 6,734,065 B2 | * | 5/2004 | Yim et al. | 438/257 |
| 6,788,574 B1 | | 9/2004 | Han et al. | |
| 6,881,626 B2 | * | 4/2005 | Lee et al. | 438/257 |
| 2002/0100930 A1 | * | 8/2002 | Yaegashi | 257/315 |
| 2003/0197238 A1 | * | 10/2003 | Park | 257/446 |
| 2004/0217441 A1 | * | 11/2004 | Lehmann et al. | 257/530 |

* cited by examiner

*Primary Examiner*—Roy Potter
(74) *Attorney, Agent, or Firm*—Slater & Matsil, L.L.P.

(57) ABSTRACT

A non-volatile memory cell and a method of manufacturing the same are provided. The non-volatile memory cell includes a semiconductor substrate, a floating gate over the semiconductor substrate, a first, a second, and a third capacitor each having a first plate and sharing a common floating gate as a second plate. The non-volatile memory cell further includes a transistor connected in series with the first capacitor. The gate electrode of the transistor is connected to a wordline of a memory array, and a source/drain region is connected to a bitline.

19 Claims, 7 Drawing Sheets

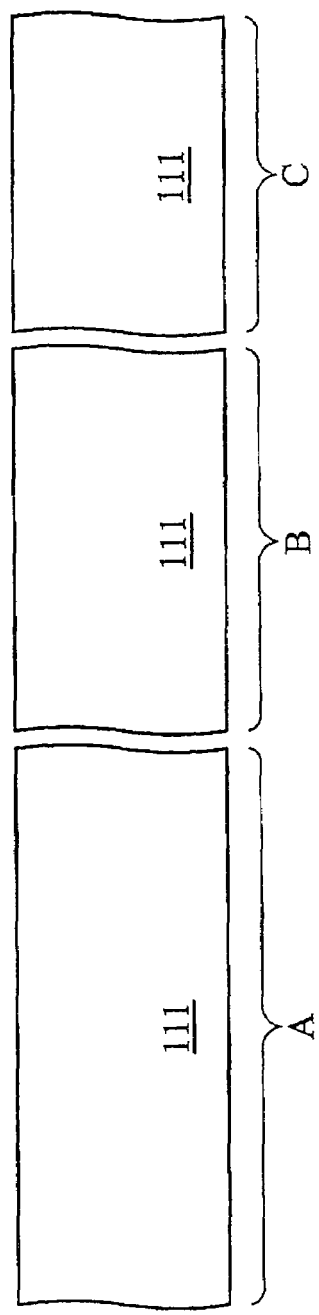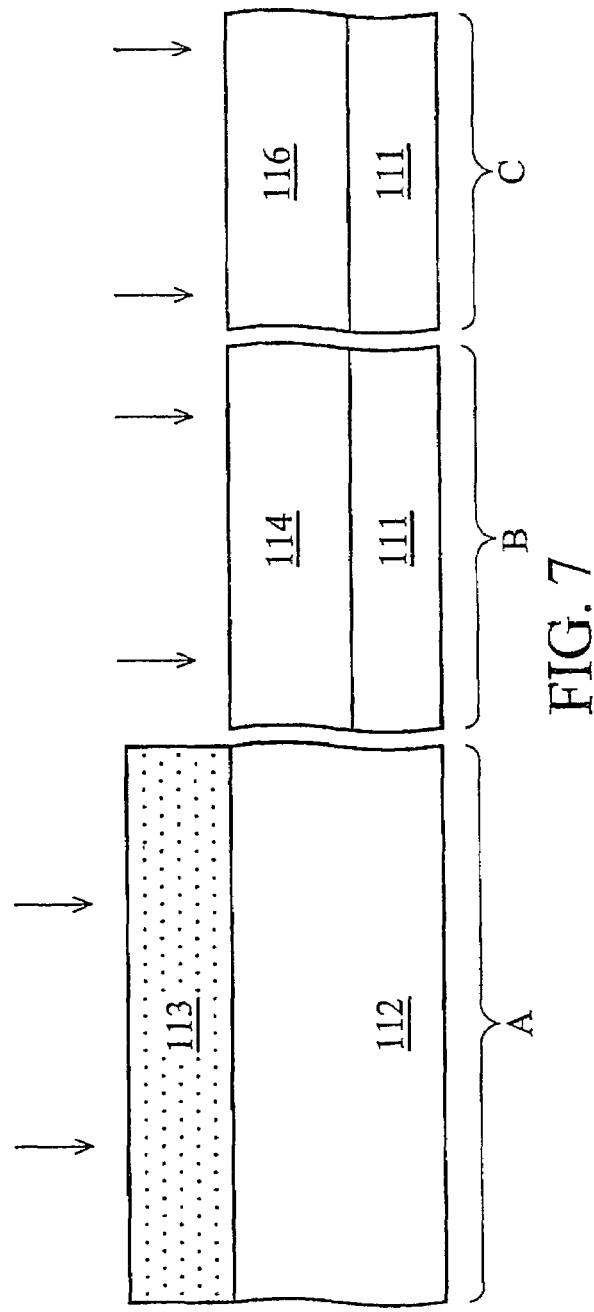

LOGIC COMPATIBLE NON-VOLATILE MEMORY CELL

TECHNICAL FIELD

This invention relates generally to semiconductor devices, and more particularly to memory cells, and even more particularly to the structure and manufacturing methods of non-volatile memory cells.

BACKGROUND

A non-volatile memory cell retains information stored in the memory cell even when the power is turned off. To create a non-volatile memory cell, typically a standard CMOS-based logic process is used as a starting foundation. Next, additional process steps are incorporated into the logic process flow to create the non-volatile memory cell. Examples of such additional process steps include second polysilicon deposition, junction dopant optimization, etc. Integrating "non-volatile memory"-specific process steps into the standard CMOS-based logic process creates complications. Consequently, embedded non-volatile memory technologies generally lag behind advanced logic fabrication processes by several generations. For a system-on-chip (SoC) approach, which requires embedding a non-volatile memory, a design team may have no choice but to accept a logic flow process usually two to three generations behind the current advanced standard logic process as well as the addition to that process of seven to eight additional lithographic masks. This prior approach not only typically increases the wafer cost, but it also falls short of the peak performance that the most advanced standard logic process can deliver.

Also, due to the cycling-induced degradation of the $SiO_2$, the previous technique of subjecting all of the non-volatile memory cell components to the higher program and erase voltages typically hastens the degradation of the $SiO_2$, thus degrading the performance and reliability of the non-volatile memory cell.

Structures and fabrication methods have therefore been explored to solve the above-discussed problems. U.S. Pat. No. 6,788,574 discusses a non-volatile memory cell 400. A top view is illustrated in FIG. 1. The non-volatile memory cell 400 consists of a tunneling capacitor 406, a coupling capacitor 402 and a read transistor 404. These three components share a single floating gate 408. The plates of the coupling capacitor 402 and the tunneling capacitor 406 that are opposite the floating gate 408 are formed by connecting respective source/drain regions of MOS devices. The transistor 404 uses the floating gate 408 as the gate electrode. The coupling capacitor 402, in conjunction with the tunneling capacitor 406, forms the charging component, which is operable to facilitate programming and erasing of information stored in the non-volatile memory cell 400. Thus, a program/erase operation enables retention of information after the power is turned off, while a read operation allows the previously stored information to be accessed after powering the memory back up. During a read operation, the information is detected using the read transistor 404.

In one embodiment, the program and erase operations of the non-volatile memory cell are achieved by tunneling electrons into and out of the floating gate 408 through the tunneling capacitor 406 to alter the charge state of the memory cell. For example, to program the non-volatile memory cell 400, a positive voltage is applied to a node 410 while a node 412 is grounded. Due to the capacitive coupling of the coupling capacitor 402 and the tunneling capacitor 406, a large voltage drop is produced across the tunneling capacitor 406, resulting in a high electric field between its two plates. When the electrical field is sufficiently high for Fowler Nordheim tunneling to occur, electrons from the active region 414 can tunnel through the insulating material between the floating gate 408 and the underlying active regions 414, and inject into the floating gate 408.

Conversely, by applying a positive voltage to the node 412 and grounding the node 410, electrons in the floating gate 408 can tunnel out of the floating gate 408, and thus the negative charge in the floating gate is reduced.

The non-volatile memory cell 400 shown in FIG. 1 suffers drawbacks, however. The memory cell is not isolated from other cells in the same memory array, thus memory cells in the same memory array affect each other. If a memory cell is at a state where the transistor 404 is on, during a read operation of other memory cells in the same memory array, current still flows through the transistor 404. For the memory array, this current is undesirable and considered to be a leakage current. With multiple cells in a memory array, the leakage current may be significant. To reduce the leakage current, it is preferred for each of the memory cells to comprise a logic circuit to control its operation. As a result, the total chip area for the memory cell and the logic circuit increases. Typically, the total area may be as great as 500 $\mu m^2$. Additionally, during the program and erase operations, electrons all tunnel through the same tunneling capacitor 406. This not only affects the reliability of the memory cell, but it also increases the chances of over-programming and/or over-erasing.

What is needed, therefore, is an improved non-volatile memory cell having reduced leakage current and requiring less chip area.

SUMMARY OF THE INVENTION

The preferred embodiment of the present invention provides a non-volatile memory cell and a method of manufacturing the same.

In accordance with one aspect of the present invention, the non-volatile memory cell includes a semiconductor substrate, a floating gate over the semiconductor substrate, a first capacitor having a first plate and the floating gate as a second plate, a second capacitor having a first plate and the floating gate as a second plate, and a third capacitor having a first plate and the floating gate as a second plate. The first plate of the first capacitor includes a first doped region and a second doped region in the semiconductor substrate. The non-volatile memory cell further includes a transistor having a gate electrode over the semiconductor substrate and a first and a second source/drain region substantially aligned with the sidewalls of the gate electrode, wherein the second source/drain region is connected to the first doped region of the first capacitor.

In accordance with another aspect of the present invention, a method of operating the non-volatile memory cell includes driving electrons into the floating gate (sometimes referred to as erasing), removing electrons from the floating gate (sometimes referred to as programming), and reading the state stored in the floating gate.

In accordance with yet another aspect of the present invention, the step of driving electrons into the floating gate includes applying appropriate voltages to the first plates of the second and third capacitors, and applying a low voltage to the first plate of the first capacitor. Due to the coupling effects, there is a voltage difference that is high enough for tunneling between the floating gate and the first plate of the first capacitor, so that electrons tunnel into the floating gate from the first plate of the first capacitor.

In accordance with yet another aspect of the present invention, the step of removing electrons from the floating gate includes applying appropriate voltages to the first plates of the first, the second and the third capacitors, so that a voltage difference is generated between the first plate of the third capacitor and the floating gate, and thus the electrons tunnel out of the floating gate into the first plate of the third capacitor.

In accordance with yet another aspect of the present invention, the step of reading the non-volatile memory cell includes turning on the transistor and detecting a current flowing through the transistor. A very small current indicates that electrons are stored in the floating gate, and a greater current indicates that electrons have been driven out of the floating gate. The state of the memory is thus determined.

In accordance with yet another aspect of the present invention, different tunneling mechanisms can be used for electron tunneling. In the preferred embodiment, the step of driving electrons into the floating gate and the step of removing electrons from the floating gate both use Fowler Nordheim tunneling. In alternative embodiments, the step of driving electrons into the floating gate uses hot-carrier injection, while the step of removing electrons from the floating gate uses Fowler Nordheim tunneling.

The transistor isolates the non-volatile memory cell from other memory cells in the same memory array. Leakage current for the memory array is thus reduced. Without the need for a control circuit per memory cell, the total chip area per memory cell is reduced. Additionally, by using different capacitors to perform the erase and program operations, the reliability of the memory cell is improved.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6 through 9 illustrate cross-sectional views of intermediate stages in the manufacture of a non-volatile memory cell.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel logic non-volatile memory (LNVM) cell and a method of forming the same are provided. The operations of the preferred embodiments are discussed. Throughout the various views and illustrative embodiments of the present invention, like reference numbers are used to designate like elements.

Figure 1:
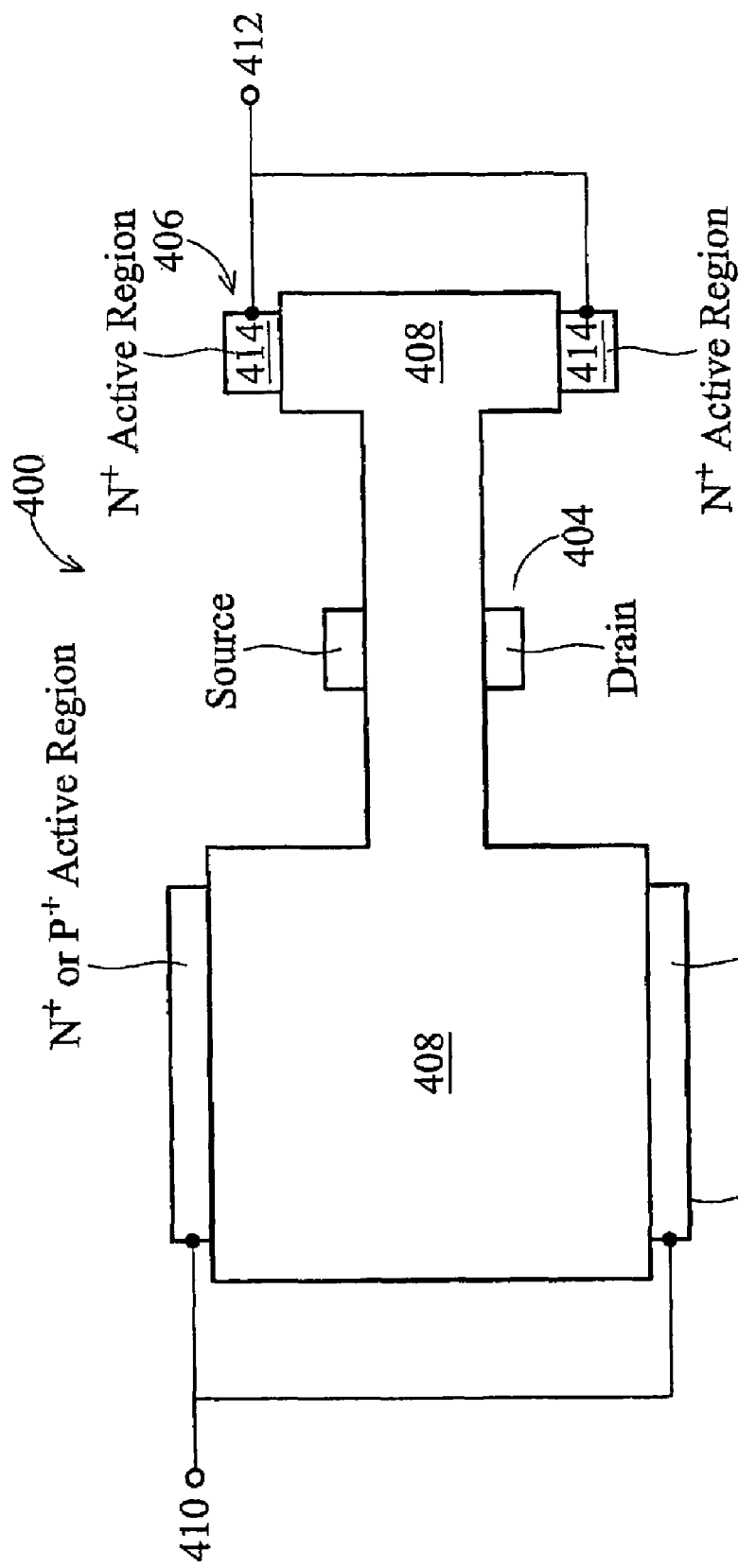
FIG. 1 illustrates a conventional non-volatile memory cell.
Figure 2:
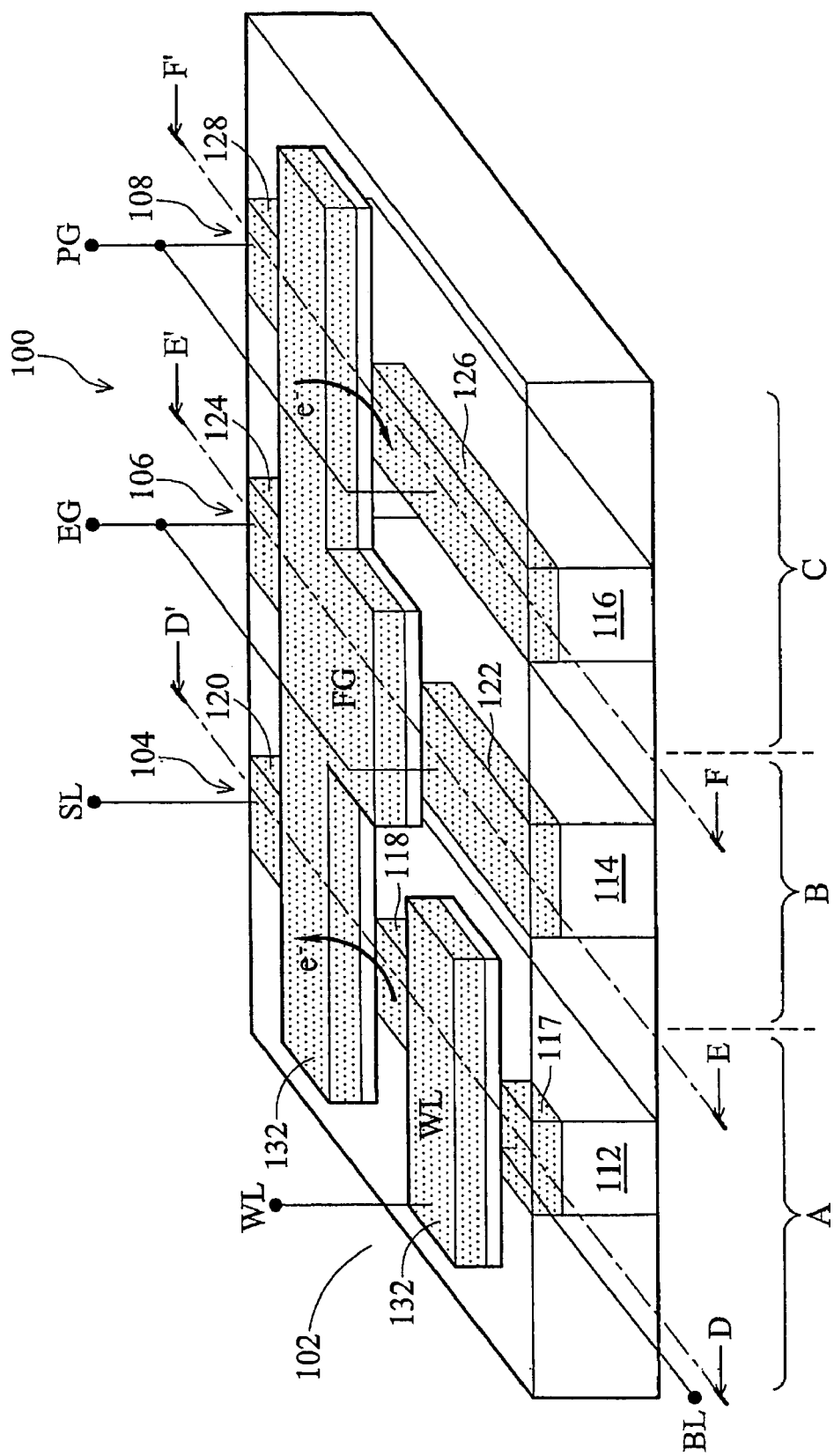
FIG. 2 illustrates a three-dimensional view of a preferred embodiment of the present invention.

FIG. 2 illustrates a three-dimensional view of a non-volatile memory cell 100, which comprises a transistor 102, a first capacitor (also referred to as an erase-tunneling capacitor) 104, a second capacitor (also referred to as a coupling capacitor) 106, and a third capacitor (also referred to as a program-tunneling capacitor) 108. The first capacitor 104, second capacitor 106 and third capacitor 108 share a common floating gate FG. The non-volatile memory cell 100 includes three regions, a region A comprising the transistor 102 and the first capacitor 104, a region B comprising the second capacitor 106, and a region C comprising the third capacitor 108. It is preferred that the region 120 substantially overlaps the floating gate FG to form the capacitor 104.

Figure 3:
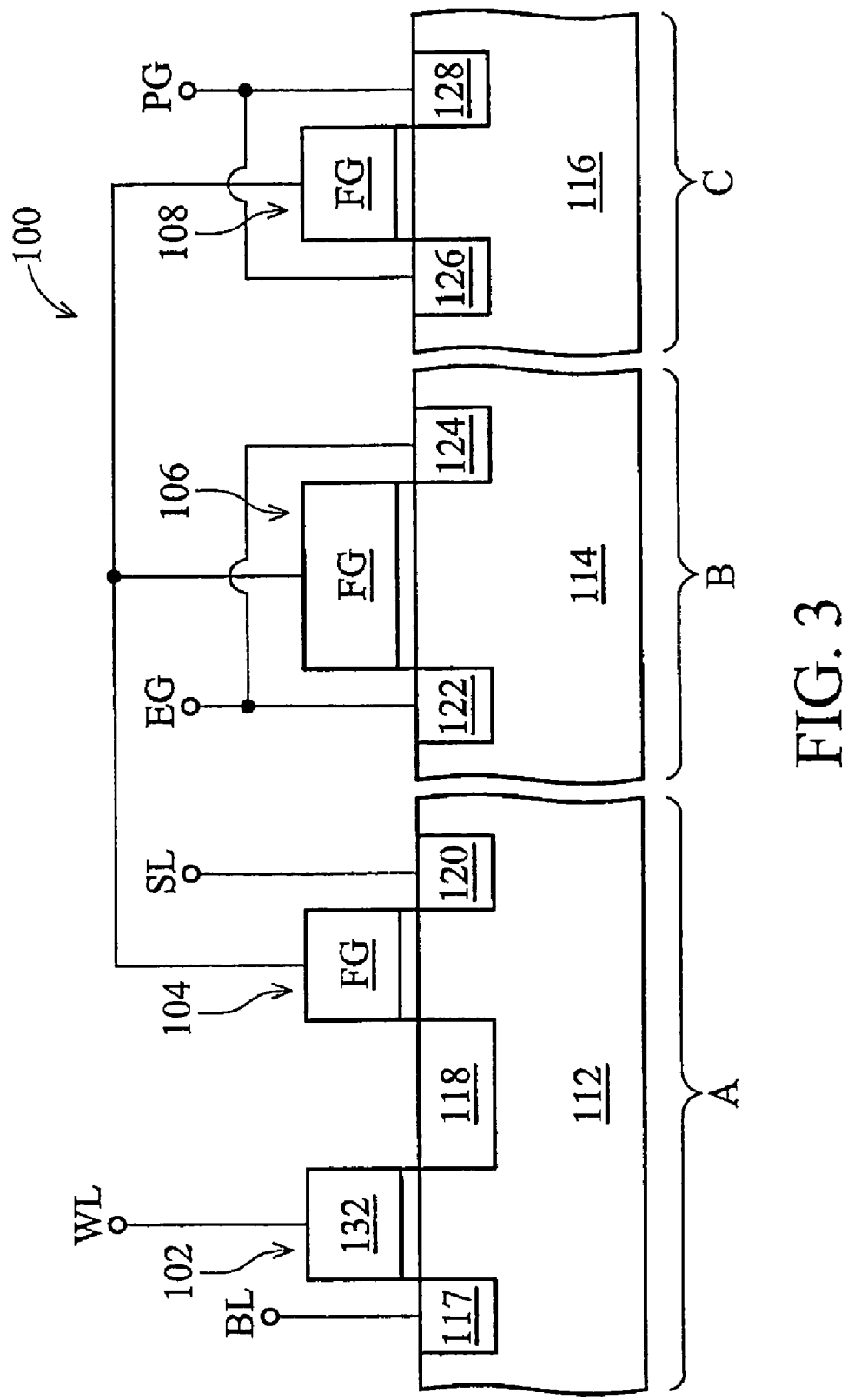
FIG. 3 illustrates a cross-sectional view of the embodiment shown in FIG. 2.

FIG. 3 illustrates a cross-sectional view of the memory cell 100, wherein the cross-sectional views of regions A, B and C are taken along vertical planes that intersect lines D-D', E-E', and F-F' in FIG. 2, respectively. For simplicity purposes, throughout the description, the cross-sectional views of regions A, B and C are shown as in one plane, although they may be in different planes. Note that the floating gate FG spans across regions A, B and C, forming one of the two plates of the first capacitor 104, the second capacitor 106 and the third capacitor 108. The doped regions 118 and a source line SL form another plate of the capacitor 104. The doped regions 122 and 124 are interconnected, forming another plate of the capacitor 106, and are connected to an erase gate (EG). The doped regions 126 and 128 are interconnected, forming another plate of the capacitor 108, and are connected to a program gate (PG). A gate electrode 132 of the transistor 102, which is connected to a wordline (WL) of a memory array, controls whether to select the memory cell 100 or not. A bitline (BL) is used to detect the state stored by the LNVM memory cell 100.

Figure 4:
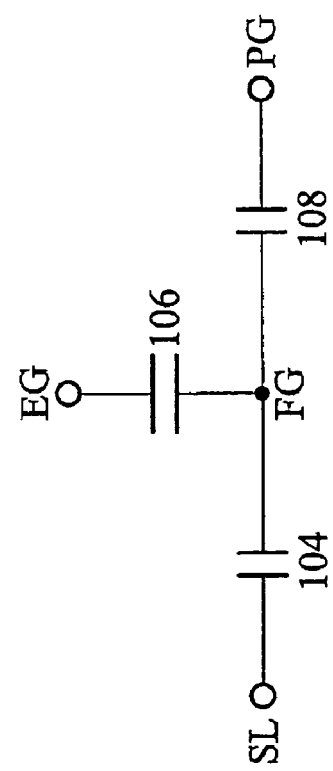

An equivalent circuit of a portion of the memory cell 100 is illustrated in FIG. 4, which includes capacitors 104, 106 and 108. During the operations of the memory cell 100, different voltages are applied to the nodes SL, EG and PG, and the voltage at the floating gate FG can be calculated accordingly. Assuming the floating gate FG stores a net charge $Q_{net}$, and further assuming there is an effective coupling between the floating gate FG and the other plates of the capacitors 104, 106 and 108, then there exists the relationship:

$$Q_{104}+Q_{106}+Q_{108}=Q_{net} \quad \text{[Eq. 1]}$$

wherein $Q_{104}$, $Q_{106}$, and $Q_{108}$ are charges stored in the capacitors 104, 106 and 108, respectively. The voltages at the nodes FG, SL, EG and PG are denoted as $V_{FG}$, $V_{SL}$, $V_{EG}$ and $V_{PG}$, respectively, and the capacitances of the capacitors 104, 106, and 108 are denoted as $C_{104}$, $C_{106}$ and $C_{108}$, respectively. Equation 1 can thus be rewritten as:

$$(V_{FG}-V_{SL})C_{104}+(V_{FG}-V_{EG})C_{106}+(V_{FG}-V_{PG})C_{108}=Q_{net} \quad \text{[Eq. 2]}$$

and thus, $$V_{FG}=(Q_{net}+(V_{SL}C_{104}+V_{EG}C_{106}+V_{PG}C_{108}))/(C_{104}+C_{106}+C_{108}). \quad \text{[Eq. 3]}$$

Therefore, the voltage $V_{FG}$ at the floating gate can be derived based on Equation 3, and the operation of the memory cell 100 can be determined accordingly.

In the preferred embodiment, the erase and program operations are performed using Fowler Nordheim (FN) tunneling, in which the program operation is typically defined to be removing electrons from the floating gate FG. Conversely, an erase operation introduces electrons into the floating gate FG. One skilled in the art will realize that the terms "erase" and "program" are terms of art, and can be defined differently.

Electrons may tunnel into or out of the floating gate FG depending on the voltages applied at the nodes SL, EG and PG. Table 1 illustrates an exemplary voltage setting for different operations, wherein $V_{WL}$ is the preferred voltage to be applied to the wordline WL, $V_{BL}(V)$ is the preferred voltage to be applied to the bitline BL, and $V_B$ is the preferred voltage to be applied to the semiconductor substrate on which the memory cell 100 is built.

TABLE 1

| | Voltage | | | | | |
|---|---|---|---|---|---|---|
| | $V_{PG}(V)$ | $V_{EG}(V)$ | $V_{WL}(V)$ | $V_{BL}(V)$ | $V_{SL}(V)$ | $V_B(V)$ |
| Read | 0/0 | 0/0 | 1.2/0 | 0.8/0 | 0/0 | 0 |
| Program | 9/2 | 0/4 | 0/0 | 0/0 | 3 | 0 |
| Erase | 9 | 9 | 0 | 0 | 0 | 0 |

Each cell in Table 1 has either one or two voltages. If two voltages are present, the first voltage will be applied to a memory cell selected to have a certain operation performed on, and the second voltage will be applied to the memory cells not selected. If only one voltage is presented, memory cells, selected or not, will be subjected to the same voltages.

To achieve better performance, the second capacitor 106 preferably has a greater capacitance than the first capacitor 104 and the third capacitor 108. For the convenience of discussion, throughout the description, the capacitances $C_{104}$ and $C_{106}$ are assumed to be equal to one unit capacitance $C$, and the capacitance $C_{108}$ is assumed to be eight times the unit capacitance C. The Equation 3 can thus be simplified as:

$$V_{FG}=Q_{net}/10C+(0.1V_{SL}+0.8V_{EG}+0.1V_{PG}).\qquad \text{[Eq. 4]}$$

From Table 1, it is found that during the program operation, $V_{PG}=9V$, $V_{EG}=0V$, and $V_{SL}=3V$, therefore, $$V_{FG}=Q_{net}/10C+(0.1*3+0.8*0+0.1*9)=Q_{net}/10C+1.2V.\qquad \text{[Eq. 5]}$$

Assuming that $Q_{net}$ is zero before programming, $V_{FG}$ equals about 1.2V. Since $V_{PG}=9V$, the voltage $V_{PG}$ at node PG is higher than the voltage $V_{PG}$ by about 7.8V, which is high enough to trigger Fowler Nordheim tunneling. Electrons therefore tunnel through the capacitor 108, moving from the floating gate FG into the node PG.

With the loss of electrons, the floating gate FG contains more positive charges, and $Q_{net}$ increases. From Equation 5, it is found that when the voltage $V_{FG}$ rises, the voltage difference between the nodes PG and FG is reduced. When the voltage difference ($V_{PG}-V_{FG}$) reduces to a certain level that is less than the voltage required by Fowler Nordheim tunneling, the FN tunneling stops.

On the other hand, voltage difference ($V_{FG}-V_{SL}$), which is applied on the first capacitor 104, is about −1.8 volts, which is not enough for Fowler Nordheim tunneling in either direction. During the program operation, $V_{FG}$ rises and eventually becomes positive. However, the voltage difference $|V_{FG}-V_{SL}|$ is less than the required voltage for Fowler Nordheim tunneling. Therefore, the net effect is that the floating gate FG contains more and more positive charges during the program operation.

The erase operation can also be analyzed by applying the voltages in Table 1 to Equation 3. From Table 1, it is found that during the erase operation, $V_{PG}=9V$, $V_{EG}=9V$, and $V_{SL}=0V$, therefore, $$V_{FG}=Q_{net}/10C+(0.1*0+0.8*9+0.1*9)=Q_{net}/10C+8.1V.\qquad \text{[Eq. 6]}$$

Since $Q_{net}/10C$ is positive, ($V_{PG}-V_{SL}$) is greater than about 8.1V, high enough for Fowler Nordheim tunneling, so that electrons tunnel through the capacitor 104 into the floating gate FG. The voltage $V_{FG}$ lowers with the introduction of electrons into the floating gate FG, until at a point, the net charge $Q_{net}$ in the floating gate FG becomes negative, and the voltage ($V_{PG}-V_{SL}$) is lower than the voltage required for Fowler Nordheim tunneling, and the Fowler Nordheim tunneling stops.

On the other hand, voltage $V_{PG}$ is high, thus the voltage difference ($V_{PG}-V_{FG}$) is lower than required for the Fowler Nordheim tunneling. Therefore, no electrons tunnel through the capacitor 108. As $V_{EG}$ equals $V_{PG}$, no electrons tunnel through the capacitor 106 either.

Please note that while the previous analysis gives a brief description of the possible operations of the preferred embodiment, the actual operation may be more complicated. The previous discussion, therefore, should not limit the scope of the present invention. Using similar techniques, the operations of the memory cells not selected can also be analyzed similarly. It will be found that no tunneling occurs for the memory cells not selected, on which the second voltages in Table 1 are applied.

In the preferred embodiment, the voltages $V_{PG}$, $V_{EG}$ and $V_{SL}$ are such chosen that the tunneling through the capacitors 104 and 108 stops after programming or erasing for a certain time. In alternative embodiments, during program operation and/or erase operation, tunneling does not stop with time. However, a dynamic balance is achieved, and the number of electrons tunneling into the floating gate FG equals the number of electrons tunneling out of the floating gate FG, so that the net charge $Q_{net}$ stays unchanged.

Figure 5:
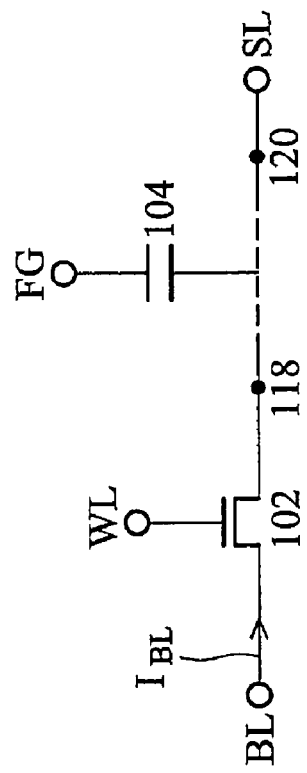
FIGS. 4 and 5 illustrate schematically equivalent circuits of the embodiment shown in FIG. 2.

An equivalent circuit diagram for a read operation is illustrated in FIG. 5, which includes the transistor 102 and the first capacitor 104. From Table 1, it is found that $V_{PG}=0V$, $V_{EG}=0V$, and $V_{SL}=0V$, therefore, Equation 3 becomes:

$$V_{FG}=Q_{net}/10C.\qquad \text{[Eq. 7]}$$

This indicates that the voltage $V_{FG}$ of the floating gate FG is determined by the charges stored. From the previous discussions, it is known that when erased, the floating gate FG contains holes, thus $V_{FG}$ is positive, and when programmed, the floating gate FG has electrons, thus $V_{FG}$ is negative. Referring to FIG. 4, when $V_{WL}=1.2V$, the transistor 102 is turned on. If the floating gate FG has a positive charge, it modulates the conductance of a channel region between nodes 118 and 120 (refer to FIG. 2), and a conductive channel region therefore exists between the nodes 118 and 120. With $V_{BL}=0.8V$, and $V_{SL}=0V$, a current $I_{BL}$, preferably in the order of tens of micro-amps, flows from the node BL to the node SL. Conversely, if the floating gate FG has a negative charge and $V_{FG}$ is negative, there is no conductive channel region between the nodes 118 and 120, and the current $I_{BL}$ is in the order of pico-amps. By detecting the current $I_{BL}$, the state of the floating gate FG, thus the state of the memory cell 100, can be read.

The preferred embodiment of the present invention, as previously discussed, uses Fowler Nordheim tunneling as the mechanism of program and erase operations. In alternative embodiments, a hot-carrier injection (HCI) mechanism can be used for the program operation, while Fowler Nordheim tunneling can be used for the erase operation. However, converse to the previously defined program and erase operations, the program operation using HCI is typically defined to be injecting electrons into the floating gate FG through the capacitor 104, and the erase operation is typically defined to be removing electrons from the floating gate FG through the capacitor 108. Table 2 illustrates an exemplary setting for using an HCI mechanism for the program operation and using Fowler Nordheim tunneling for the erase operation.

TABLE 2

| | \multicolumn{6}{c}{Nodes} | | | | | |
|---|---|---|---|---|---|---|
| | $V_{PG}(V)$ | $V_{EG}(V)$ | $V_{WL}(V)$ | $V_{BL}(V)$ | $V_{SL}(V)$ | $V_B(V)$ |
| Read | 0/0 | 0/0 | 1.2/0 | 0.8/0 | 0/0 | 0 |
| Program | 0/0 | 6/0 | 2.5/0 | 0/3.3 | 6.0/6.0 | 0 |
| Erase | 9 | 0 | 0 | 0 | 0 | 0 |

In the preferred embodiments of the present invention, the transistor 102 (refer to FIG. 2) isolates the memory cell from the rest of the memory cells in the same memory array that are not selected. By turning off the transistor 102, no (leakage) current is drawn from the memory if the current memory cell is not selected. Therefore, a control circuit for the memory is not needed. This in turn significantly reduces the chip area per memory cell. For example, a 30 $\mu m^2$/cell chip occupancy can be achieved. Additionally, using capacitors 104 and 108 to perform erase and program operations separately, the reliability of the memory cell is improved.

FIGS. 6 through 9 illustrate cross-sectional views of intermediate stages in the manufacture of a preferred embodiment. Again, for convenience of illustration, the cross-sectional views of the regions A, B and C (refer to FIG. 3) are shown in one plane, and the cross-sectional views are taken from lines D-D', E-E' and F-F', respectively. Please refer to FIG. 2 for the geometry distribution of the respective features by identifying feature numbers accordingly.

Referring to FIG. 6, a substrate 111 is provided. The substrate 111 preferably comprises a semiconductor material such as silicon, although other semiconductor materials may be used. The substrate 111 is preferably P-type. Alternatively, the substrate 111 can comprise an N-type substrate. An N-type barrier layer (not shown) may optionally be formed.

A photo resist 113 is patterned using lithography techniques, as shown in FIG. 7. An N-type impurity implantation is then performed in order to form N-well regions 114 and 116 in regions B and C, respectively. The N-well regions 114 and 116 preferably comprise antimony and/or arsenic, which neutralizes the P-type impurities in the P-type substrate 111 and converts the implanted region to N-type. Due to the masking by the photo resist 113, region A, which is masked by the photo resist 113, forms a P-well region 112. The photo resist 113 is then removed. In the preferred embodiment, a P-well region is formed in region A for the subsequent formation of an N-type transistor. In alternative embodiments, region A is not masked, and an N-well region is preferably formed for the subsequent formation of a P-type transistor.

Figure 8:
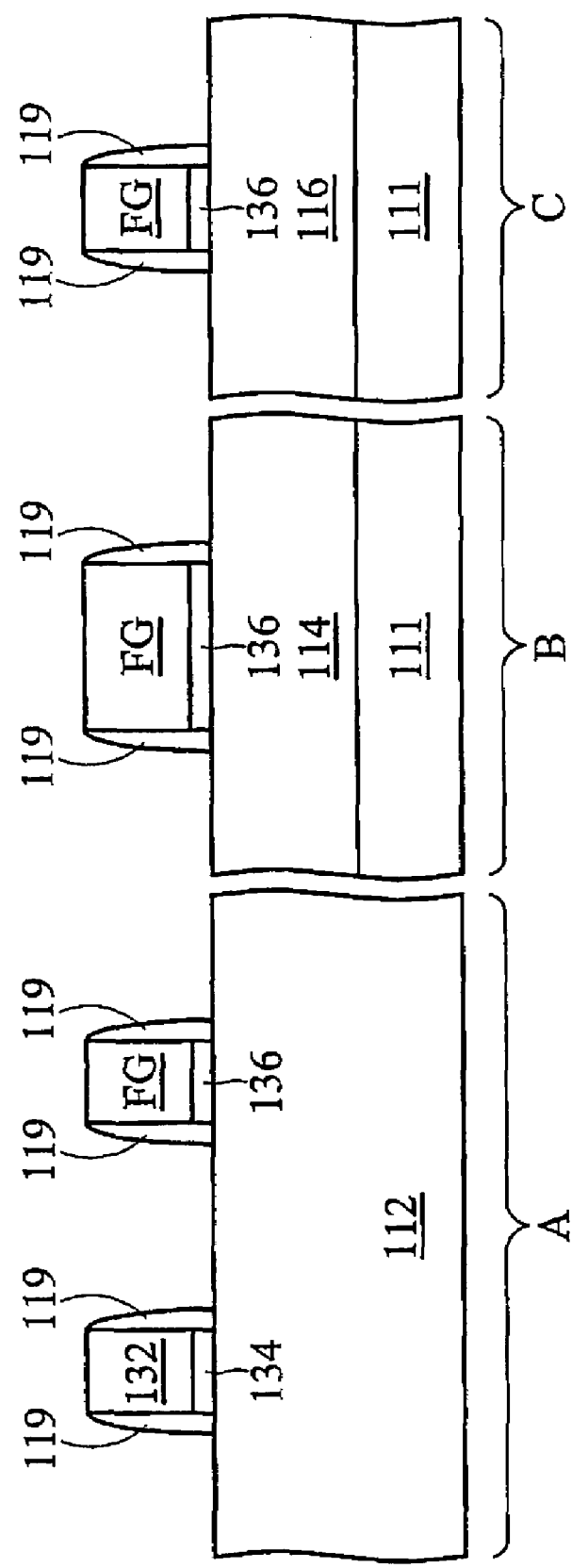

FIG. 8 illustrates the formation of gate dielectrics 134 and 136, a gate electrode 132, the floating gate FG and gate spacers 119. The formation processes are well known in the art, and thus are not repeated herein. It is to be noted that the material and thickness of the gate dielectrics 136 partially determine the voltage required for tunneling. One skilled in the art will be able to find a suitable material and thickness through routine experiments. In the preferred embodiment, the gate dielectrics 136 comprise oxide, and have a thickness of between about 20 Å and about 200 Å. The gate dielectrics 136 may have a composite structure, such as an oxide-nitride-oxide structure. The floating gate FG preferably extends throughout the regions A, B and C (refer to FIG. 2), although they may be formed separated and connected by conductive lines. The areas of the floating gate FG in the regions A, B and C determine the capacitances of the subsequently formed capacitors 104, 106 and 108, respectively. Preferably, the floating gate FG has an area in region B of between about 0.01 times and about 1000 times the areas in regions A, and between about 0.01 times and about 1000 times the areas in region C. Please note that different capacitance ratios may cause different operation mechanisms, such as FN tunneling and HCI tunneling.

Figure 9:
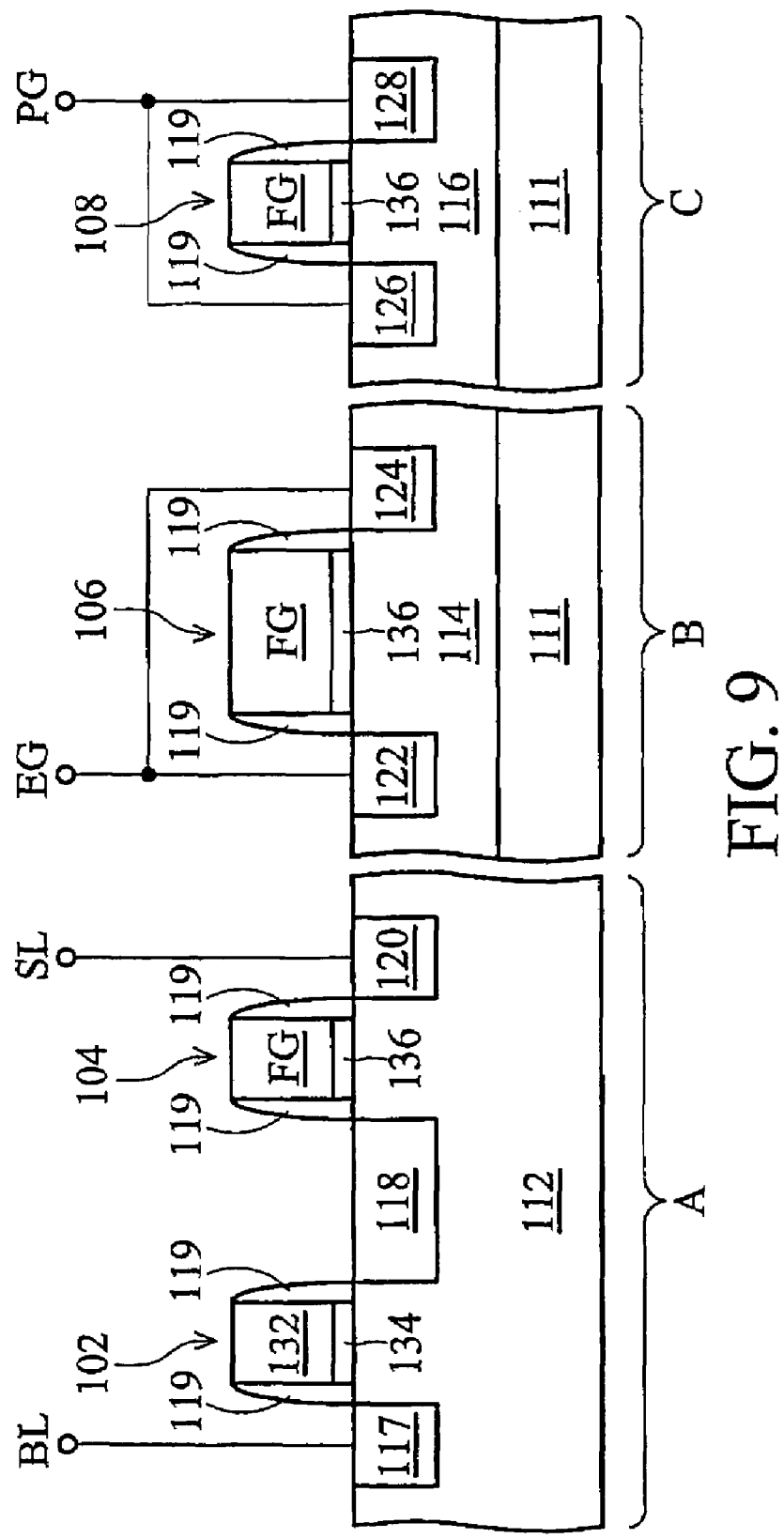

Doped regions 117, 118, 120, 122, 124, 126 and 128 are formed, as illustrated in FIG. 9. In the preferred embodiment, wherein region 112 is a P-well region, the doped regions 117 and 118 are of N-type. Otherwise, the doped regions 117 and 118 are of P-type. Doped regions 120, 122, 124, 126 and 128, however, may have any combination of types. Preferably, region 120 extends substantially under the floating gate FG, thus they have substantial overlap. The overlap can be formed by using methods such as tilt implanting. As is known in the art, P-type doped regions and N-type doped regions are separately implanted with the masking of photo resists (not shown).

Doped regions 122 and 124 are then interconnected and connected to the voltage source EG. The doped regions 122, 124 and a channel region therebetween form one of the two plates of the coupling capacitor 106. Doped regions 126 and 128 are interconnected and connected to the voltage source PG. The doped regions 126 and 128 and a channel region therebetween form one of the two plates of the coupling capacitor 108. The source line (SL) is connected to the doped region 120, and the bitline (BL) is connected to the doped region 117. The gate electrode 132 is connected to a wordline of the memory array (not shown).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile memory cell comprising:

a semiconductor substrate;

a floating gate over the semiconductor substrate;

a first capacitor comprising a first plate, the floating gate, and a dielectric therebetween;
a second capacitor comprising a second plate, the floating gate, and a dielectric therebetween;
a third capacitor comprising a third plate, the floating gate, and a dielectric therebetween;
the first plate of the first capacitor comprising a first doped region and a second doped region in the semiconductor substrate; and
a transistor comprising:
 a gate electrode over the semiconductor substrate; and
 a first and a second source/drain region substantially aligned with opposite sidewalls of the gate electrode, wherein the second source/drain region is connected to the first doped region of the first capacitor.

2. The non-volatile memory cell of claim 1 wherein the transistor is an NMOS transistor, and wherein the first and second source/drain regions are formed in a P-well region in the semiconductor substrate.

3. The non-volatile memory cell of claim 1 wherein the transistor is a PMOS transistor, and wherein the first and second source/drain regions are formed in an N-well region in the semiconductor substrate.

4. The non-volatile memory cell of claim 1 wherein the second capacitor has a capacitance of between about 0.01 and 1000 times a capacitance of the first capacitor.

5. The non-volatile memory cell of claim 1 wherein the second capacitor has a capacitance of between about 0.01 and 1000 times a capacitance of the third capacitor.

6. The non-volatile memory cell of claim 1 wherein the second and the third capacitors each comprise:
 the floating gate over the semiconductor substrate; and
 a first doped region and a second doped region in the semiconductor substrate and on opposite sides of the floating gate, wherein the first doped region and the second doped region are interconnected.

7. The non-volatile memory cell of claim 5 wherein each of the first doped regions and the second doped regions comprise a material selected from the group consisting essentially of P-type material and N-type material.

8. The non-volatile memory cell of claim 1 wherein the gate electrode of the transistor is connected to a wordline of a memory array.

9. The non-volatile memory cell of claim 1 wherein the first source/drain region of the transistor is connected to a bitline of a memory array.

10. An integrated circuit comprising:
a non-volatile memory cell comprising:
 a first, a second and a third active region;
 a first dielectric layer over the first active region;
 a second dielectric layer over the second active region;
 a third dielectric layer over the third active region;
 a first conductor across the first, the second and the third active regions, wherein the first conductor is separated from the first the second and the third active regions by the first, the second and the third dielectric layers, respectively, and wherein the first conductor is floating;
 each of the first, the second and the third active regions comprising a first and a second doped region on opposite sides of the first conductor, wherein the first and the second doped regions in the second active region are interconnected, and the first and the second doped regions in the third active region are interconnected;
 a fourth dielectric layer on the first active region;
 a second conductor over the fourth dielectric layer;
 a first and a second source/drain region in the semiconductor substrate and substantially aligned with opposite sidewalls of the second conductor, wherein the second source/drain region is electrically coupled to the first doped region in the first active region.

11. The integrated circuit of claim 10 wherein the first doped regions and the second doped regions in the second and the third active regions each comprise a material selected from the group consisting essentially of P-type material and N-type material.

12. The integrated circuit of claim 10 wherein the first and the second source/drain regions are of P-type.

13. The integrated circuit of claim 10 wherein the first and the second source/drain regions are of N-type.

14. The integrated circuit of claim 10 wherein the first and the second doped regions of the second active region are formed in an N-well region.

15. The integrated circuit of claim 10 wherein the first and the second doped regions of the third active region are formed in an N-well region.

16. The integrated circuit of claim 10 wherein the second source/drain region of the transistor and the first doped region in the first active region form a continuous region.

17. The integrated circuit of claim 10 wherein the first, the second and the third dielectric layers form a continuous dielectric layer.

18. The integrated circuit of claim 10 wherein the first, the second and the third dielectric layers have an oxide-nitride-oxide structure.

19. The integrated circuit of claim 10 wherein the second doped region in the first active region substantially overlaps the first conductor.

* * * * *